(12) United States Patent
Chen et al.

(10) Patent No.: US 11,540,420 B2
(45) Date of Patent: Dec. 27, 2022

(54) ACTIVE COOLING DEVICES FOR COOLING AN ELECTRONIC ASSEMBLY DOWNSTREAM OF A COMPUTING SYSTEM

(71) Applicant: QUANTA COMPUTER INC., Taoyuan (TW)

(72) Inventors: Jen-Mao Chen, Taoyuan (TW); Shao-Yu Chen, Taoyuan (TW); Sin-Hong Lien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/186,509

(22) Filed: Feb. 26, 2021

(65) Prior Publication Data

US 2022/0279677 A1 Sep. 1, 2022

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01)

(58) Field of Classification Search
CPC .. H05K 7/2039; H05K 1/0203; H05K 7/1489; H05K 7/1487; H05K 7/20736; H05K 7/20709; H05K 7/20145; H05K 7/20136; H05K 7/20727; H05K 7/20718
See application file for complete search history.

(56) References Cited

U.S. PATENT DOCUMENTS

| | | | | |
|---|---|---|---|---|
| 2010/0328878 | A1* | 12/2010 | Fujiwara | G06F 1/203 361/679.48 |
| 2011/0157824 | A1* | 6/2011 | Fujiwara | F04D 13/12 415/206 |
| 2012/0114512 | A1* | 5/2012 | Lofy | F04D 29/703 417/410.1 |
| 2012/0182688 | A1* | 7/2012 | McColloch | H04B 10/40 361/692 |
| 2013/0051738 | A1* | 2/2013 | Ito | G02B 6/4246 385/92 |
| 2014/0056592 | A1* | 2/2014 | McColloch | H04B 10/40 29/428 |
| 2019/0116689 | A1* | 4/2019 | Chen | H05K 7/20145 |
| 2019/0190605 | A1* | 6/2019 | Zhang | H04B 10/40 |

* cited by examiner

*Primary Examiner* — Adam B Dravininkas
(74) *Attorney, Agent, or Firm* — Nixon Peabody LLP (57) ABSTRACT

Embodiments of the disclosure relate to active cooling devices for cooling an electronic assembly positioned downstream in a computing system. In one embodiment, an electronic assembly positioned downstream of the computing system is disclosed. The electronic assembly includes a printed circuit board electrically connected to the computing system; an air duct disposed over the printed circuit board; and an active cooling device thermally coupled to the printed circuit board. The printed circuit board includes a transceiver socket configured to receive at least one optical transceiver and one or more heat-generating components disposed thereon. The at least one optical transceiver is configured to mate with an active optical cable.

14 Claims, 5 Drawing Sheets

ACTIVE COOLING DEVICES FOR COOLING AN ELECTRONIC ASSEMBLY DOWNSTREAM OF A COMPUTING SYSTEM

TECHNICAL FIELD

The present disclosure relates generally to cooling devices for electronic devices, and more specifically, to active cooling devices for cooling an electronic assembly positioned downstream of a computing system.

BACKGROUND

Computing systems, such as servers, include electronic components that are connected to a power supply unit. The electronic components typically include controllers, processors, LAN cards, hard disk drives, and solid state disk drives. Servers generate an enormous amount of heat due to the operation of the electronic components. Overheating from inefficient removal of heat can potentially shut down or impede the operation of the electronic components.

As an example, an Open Compute Project 3.0 module (hereinafter 'OCP module') in a server can consume substantial power and generate significant heat. When the OCP module is positioned downstream of the power supply unit, it is heated by the electronic components positioned nearby. The airflow through the OCP module is reduced as well. This results in a performance reduction even with the use of traditional passive cooling solutions such as air ducts and baffles. Accordingly, it is desirable to incorporate better cooling solutions to ensure dissipation of the generated heat such that the performance of the server remains unaffected.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

In one embodiment, an electronic assembly positioned downstream of a computing system is disclosed. The electronic assembly includes a printed circuit board electrically connected to the computing system; an air duct disposed over the printed circuit board; and an active cooling device thermally coupled to the printed circuit board. The printed circuit board includes a transceiver socket configured to receive at least one optical transceiver and one or more heat-generating components disposed thereon. The at least one optical transceiver is configured to mate with an active optical cable.

In another embodiment, a computing system is disclosed. The computing system includes a plurality of fans configured to drive airflow downstream of the computing system and an electronic assembly positioned downstream of the computing system. The electronic assembly includes a printed circuit board electrically connected to the computing system; an air duct disposed over the printed circuit board; and an active cooling device thermally coupled to the printed circuit board. The printed circuit board includes a transceiver socket configured to receive at least one optical transceiver and one or more heat-generating components disposed thereon. The at least one optical transceiver is configured to mate with an active optical cable.

In yet another embodiment, a method of controlling an active cooling device thermally coupled to a network interface controller (NIC) expansion card in a computing system is disclosed. The method includes receiving temperature information of one or more heat-generating components on the electronic assembly at fixed time intervals, and obtaining one or more functional parameters of the active cooling device during the fixed time intervals. The method further includes adjusting the one or more functional parameters of the active cooling device in response to a predetermined temperature difference between an operational temperature information and the received temperature information of the one or more heat-generating components on the electronic assembly The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings, in which.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments of the present disclosure are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of" or "within acceptable manufacturing tolerances," or any logical combination thereof, for example.

With regards to the present disclosure, the terms "computing device" or "computing system" or "computing system" or "computer" refer to any electronically-powered or battery-powered equipment that has hardware, software, and/or firmware components, where the software and/or firmware components can be configured for operating features on the device.

Embodiments of the disclosure relate to active cooling devices for cooling an electronic assembly positioned downstream in a computing system. The active cooling device is thermally coupled to the OCP module to remove heat generated by the electronic components in the electronic assembly and dissipate the removed heat into the environment outside the OCP module. The active cooling device may be installed on an air duct. The air duct is disposed in the OCP module and designed to direct airflow downstream of the OCP module.

Figure 1:
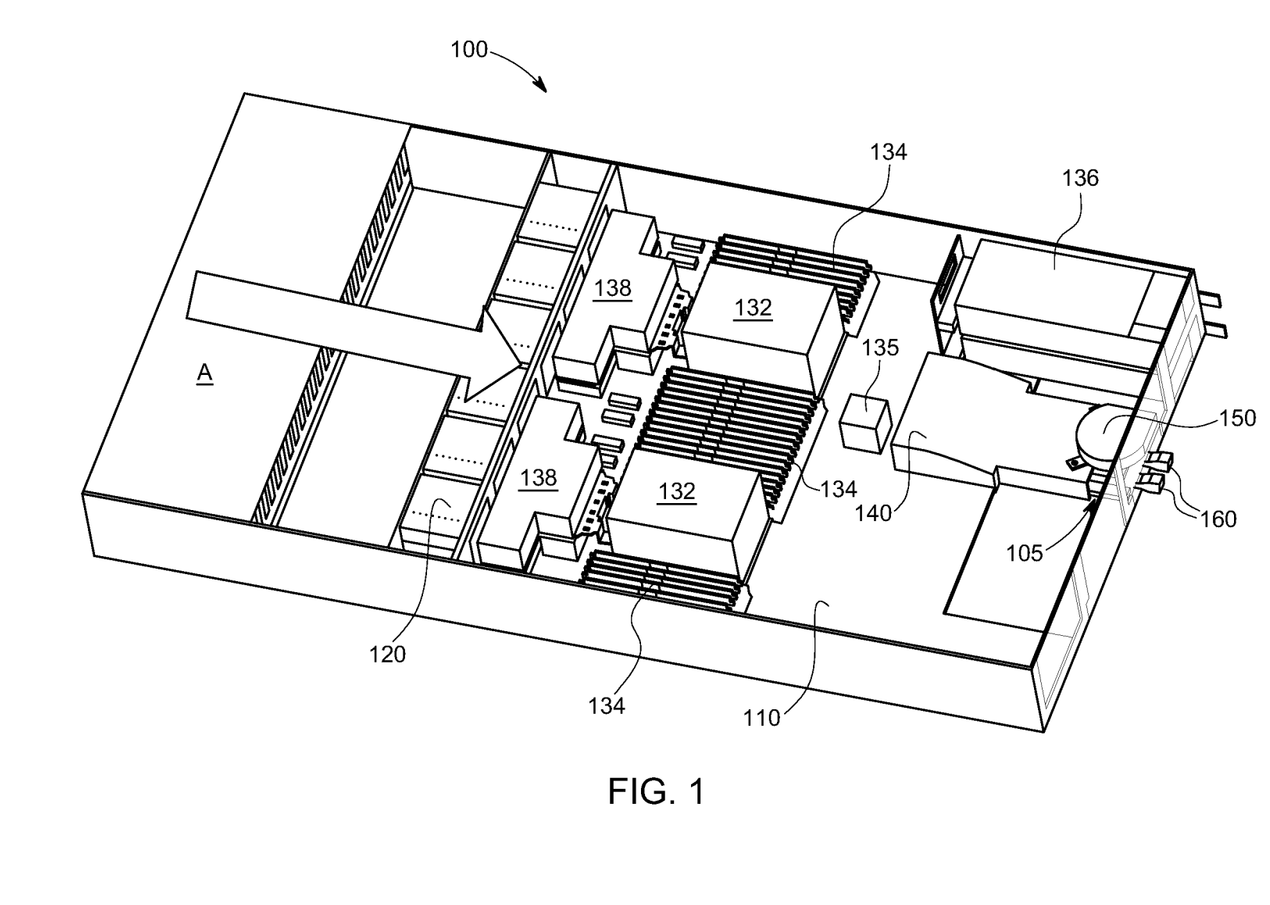
FIG. 1 is a perspective view of a computing system having an electronic assembly, according to one or more embodiments shown and described herein.
Figure 2:
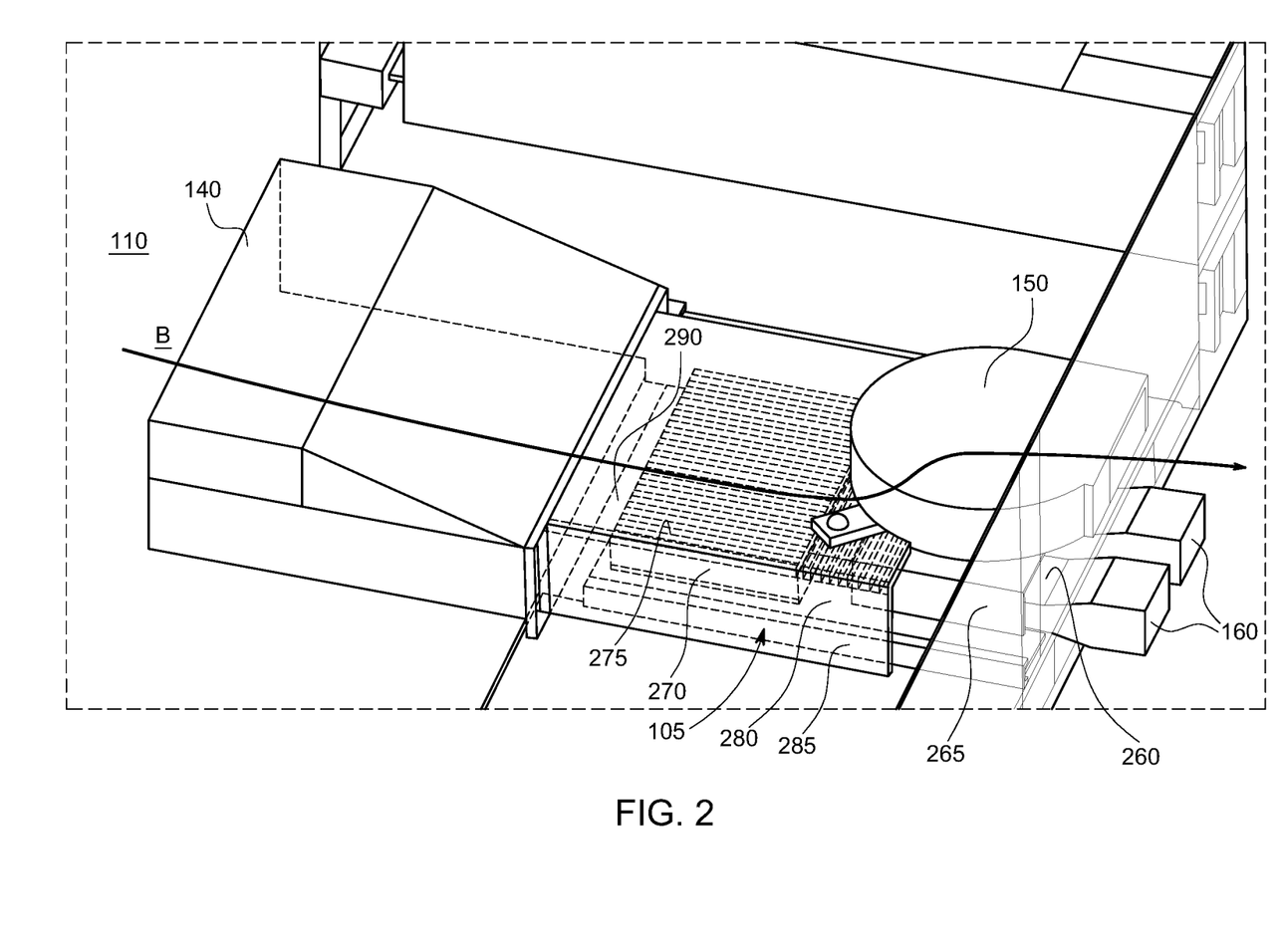
FIG. 2 is a close-up perspective view of a downstream section of the computing system showing the electronic assembly and an active cooling device disposed thereon, according to one or more embodiments shown and described herein.

FIG. 1 shows a perspective view of a computing system 100 having an electronic assembly 105, while FIG. 2 is a close-up perspective view of a downstream section of the computing system 100. The computing system 100 may be any computer device such as, but not limited to, a high-performance computing server, an electronic storage device in a data center, an edge server for telecommunications, an optical switch, and an optical router. In some embodiments, the electronic assembly 105 is an OCP module, while in other embodiments, the electronic assembly 105 may be any electronic module that generates a large amount of heat during operation of the computing system 100. The computing system 100 includes a motherboard 110. One or more processors 132, memory devices 134, one or more power supply units 136, a chassis management controller (CMC) 138, and other electronic components are disposed on the motherboard 110. The electronic components are cooled by a plurality of fans 120 positioned upstream of the electronic components and configured to drive airflow downstream of the computing system 100 towards the electronic assembly 105. The CMC 138 controls the output from the power supply unit (not shown) of the computing system 100 and the plurality of fans 120.

Referring to FIGS. 1-2, the electronic assembly 105 is positioned downstream of the electronic components in the computing system 100 and adjacent to a baseboard management controller (BMC) 135. The BMC 135 periodically monitors power data and other support for the electronic components of the computing system 100 anywhere between once every second to once every 60 seconds, but can be less frequent. In some embodiments, the monitoring rate of the BMC 135 can be dependent on the temperature and/or power data associated with the electronic components of the computing system 100.

The electronic assembly 105 includes a printed circuit board (PCB) 280 electrically connected to the computing system 100. The PCB 280 is disposed within a PCB holder 285. In some embodiments, the PCB 280 is a Network Interface Controller (NIC) expansion card, a Peripheral Component Interconnect Express (PCIe) circuit card, or an Open Compute Project 3.0 circuit card (hereinafter 'OCP card') in an OCP module. In other embodiments, the PCB 280 is any printed circuit board having a number of electronic components disposed thereon.

The PCB 280 includes transceiver sockets 265 disposed thereon. The transceiver sockets 265 are electrically connected to the motherboard 110 of the computing system 100 through electrical sockets 290. An individual transceiver socket 265 is configured to receive an optical transceiver 160. In the embodiments shown in FIGS. 1-2, there are two optical transceivers 160, but any number of optical transceivers may be used. The optical transceivers 160 project outwards from the electronic assembly 105 through the transceiver sockets 265. An individual optical transceiver 160 is configured to mate with an active optical cable that carries optical signals for transmission to and reception by the electronic components on the electronic assembly 105.

One or more heat-generating components 270 are disposed on the PCB 280. In some embodiments, the heat-generating component 270 is an application-specific integrated circuit (ASIC) configured to a perform a desired function such as, but not limited to, signal exchanging from the optical transceivers 160. In some embodiments, the heat-generating component 270 has an embedded temperature sensor (not shown) configured to detect the temperature of the heat-generating component 270, the optical transceivers 160, and/or the PCB 280. In some embodiments, as shown in FIG. 2, the heat-generating component 270 is thermally disposed within a heatsink 275.

An active cooling device 150 is thermally coupled to the electronic assembly 105 and configured to remove heat and cool the electronic assembly 105. In the embodiment shown in FIGS. 1-2, the active cooling device 150 is mechanically fastened to the PCB 280 of the electronic assembly via an air duct 140 disposed on the PCB 280 and configured to drive airflow over the electronic assembly 105 downstream. The air duct 140 is further described in detail with respect to FIG.

Figure 3:
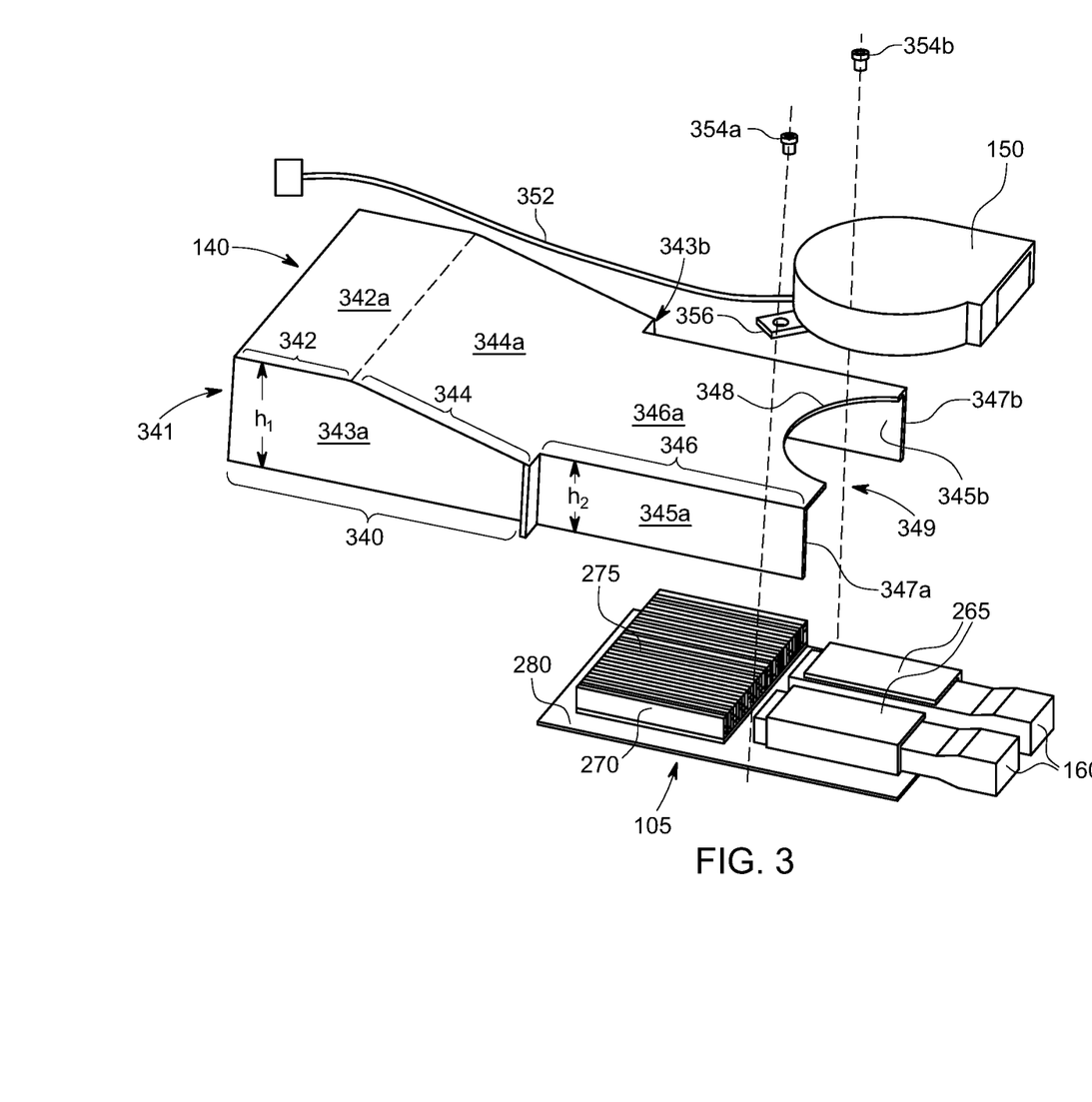
FIG. 3 is an exploded perspective view of the active cooling device coupled to the electronic assembly disposed in the downstream section of the computing system, according to one or more embodiments shown and described herein.

3. In the embodiment shown in FIGS. 1-2, the active cooling device 150 is a blower fan. However, in other embodiments, the active cooling device 150 may be a liquid cooling system, a semiconductor cooling chip, or a heat pipe. The active cooling device 150 is operably controlled through the BMC 135 positioned adjacent to the electronic assembly 105 in the computing system 100.

FIG. 3 is an exploded perspective view of the active cooling device 150 coupled to the electronic assembly 105 disposed in the downstream section of the computing system 100. As shown in the exploded view of FIG. 3, the air duct 140 is disposed over the electronic assembly 105 and overlays the transceiver sockets 265 and the heat-generating components encapsulated within the heatsink 275 on the PCB 280. The air duct 140 has an upstream open end 341 and a downstream open end 349 positioned opposite to and downstream of the upstream open end 341. The air duct 140 has an upstream portion 340 at the upstream open end 341 and a downstream portion 346 at the downstream open end 349.

The upstream portion 340 includes a first portion 342, a second portion 344, and first sidewalls 343a and 343b on either side of the upstream portion 340. The first portion 342 has a flat top surface 342a at a height $h_1$ from the PCB 280. The second portion 344 has a sloping surface 344a which connects the top surface 342a of the first portion 342 with a flat top surface 346a of the downstream portion 346 at a height $h_2$ from the PCB 280, where $h_1$ is greater than $h_2$. The flat top surface 346a of the downstream portion 346 ends in a horizontal edge 348 at the downstream open end 349. In some embodiments, such as the one shown in FIG. 3, the horizontal edge 348 is curved to a semicircular shape. The downstream portion 346 includes second sidewalls 345a and 345b, along which the downstream portion 346 has vertical edges 347a and 347b at the downstream open end 349. Airflow entering the upstream portion 342 from the computing system 100 at the upstream open end 341 is directed to exit the downstream portion 346 at the downstream open end 349. The sloping surface 344a in the upstream portion 340 enables the transition of the airflow from the upstream open end 341 to the downstream open end 349 of the air duct 140, carrying away some of the heat generated in the electronic assembly 105 to the ambient exterior environment.

The active cooling device 150 is electrically connected to motherboard 110 (FIGS. 1-2) via a power and control cable 352. As shown in FIG. 3, the active cooling device 150 has one or more apertures 356 tabbed thereto. The active cooling device 150 is coupled to the PCB 280 using fasteners 354a, 354b through the apertures 356. In some embodiments, more than one such active cooling device 150 maybe coupled to the PCB 280. In embodiments where the active cooling devices 150 are blower fans, each of the different blower fans may have different fan speeds which may or may not be controlled separately. This enables more targeted cooling and associated power settings.

Figure 4:
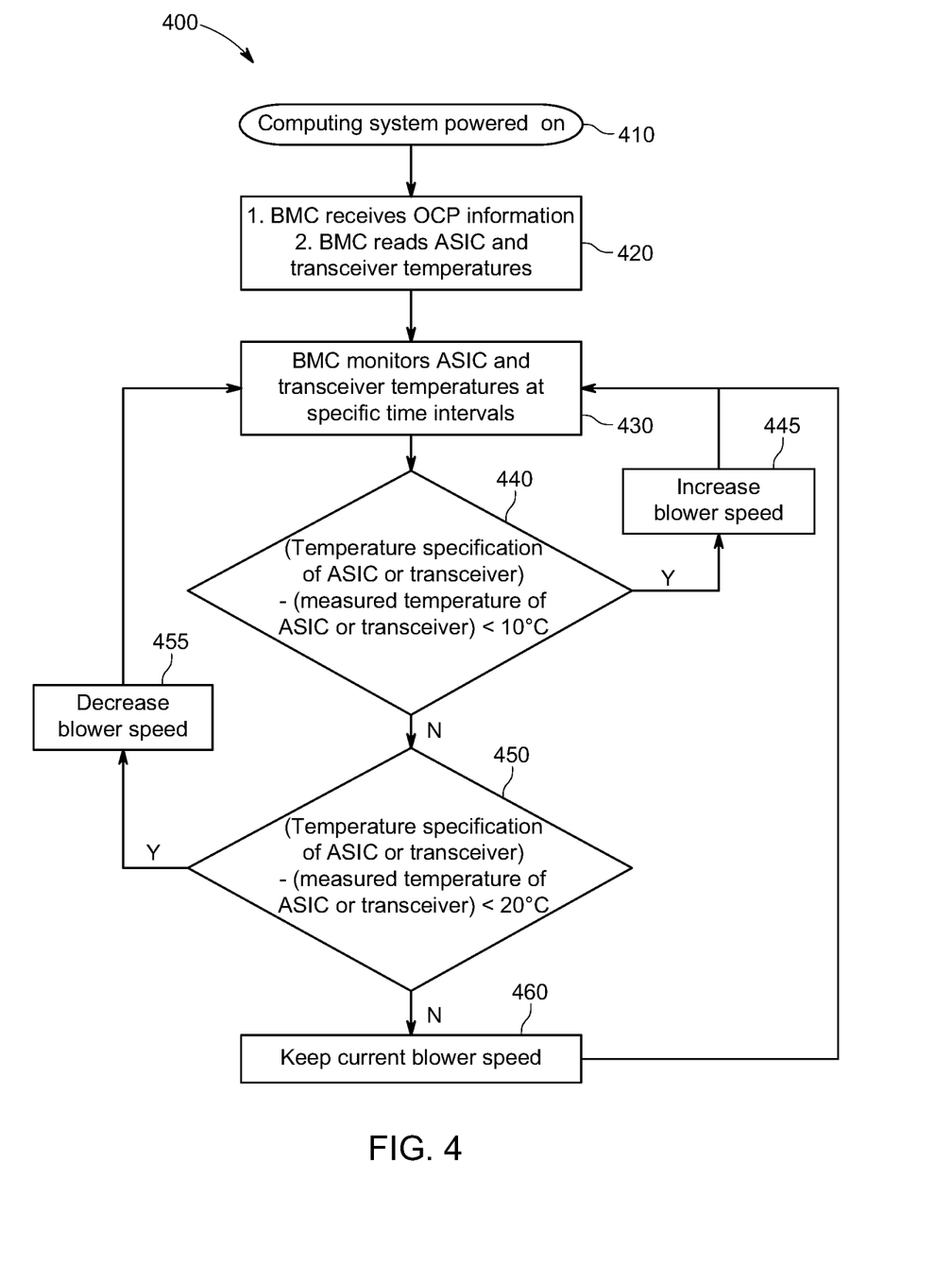
FIG. 4 shows a flow chart of a method of controlling the active cooling device of FIGS. 2-3 using a baseboard management controller (BMC) disposed in the computing system, according to one or more embodiments shown and described herein.

FIG. 4 shows a flow chart of a method 400 of controlling the active cooling device 150 shown in FIGS. 2-3, using the BMC 135 in the computing system 100. In step 410, the computing system 100 is turned on. Subsequently in step 420, the BMC 135 connects with and obtains information about the electronic assembly 105, which in the embodiments shown in FIG. 1-3 is an OCP module. The BMC 135 receives temperature information about the one or more heat-generating components 270 and the optical transceivers 160 from a temperature sensor (not shown) thermally coupled to the one or more heat-generating components 270 and/or PCB 280, as mentioned above.

In step 430, the BMC 135 monitors the temperature variations of the one or more heat-generating components 270 and the optical transceivers 160 at fixed time intervals. In some embodiments, the fixed time intervals may be about 10 seconds or about 20 seconds. The BMC 135 reaches a decision point 440 depending on the inputted temperature values of the one or more heat-generating components 270 and the optical transceivers 160. At the decision point 440, if the temperature of the one or more heat-generating components 270 and the optical transceivers 160 is less than 10° C. from reaching the maximum operating temperature defined in the specification of the one or more heat-generating components 270 and the optical transceivers 160, then the BMC 135 moves to step 445, where it decides to increase the speed of the blower fans in the active cooling device 150.

On the other hand, at decision point 440, if the temperature of the one or more heat-generating components 270 and the optical transceivers 160 is more than 10° C. from reaching the maximum operating temperature defined in the specification of the one or more heat-generating components 270 and the optical transceivers 160, then the BMC 135 moves to a decision point 450.

At the decision point 450, if the temperature of the one or more heat-generating components 270 and the optical transceivers 160 is less than 20° C. from reaching the maximum operating temperature defined in the specification of the one or more heat-generating components 270 and the optical transceivers 160, then the BMC 135 moves to step 455, where it decides to decrease the speed of the blower fans in the active cooling device 150. Otherwise, at decision point 450, if the temperature of the one or more heat-generating components 270 and the optical transceivers 160 is more than 20° C. from reaching the maximum operating temperature defined in the specification of the one or more heat-generating components 270 and the optical transceivers 160, then the BMC 135 moves to step 460, where it decides to keep the current speed of the blower fans in the active cooling device 150. This process of adjusting the speed of the blower fans in the active cooling device 150 keeps iterating throughout the operation of the computing system 100.

Figure 5:
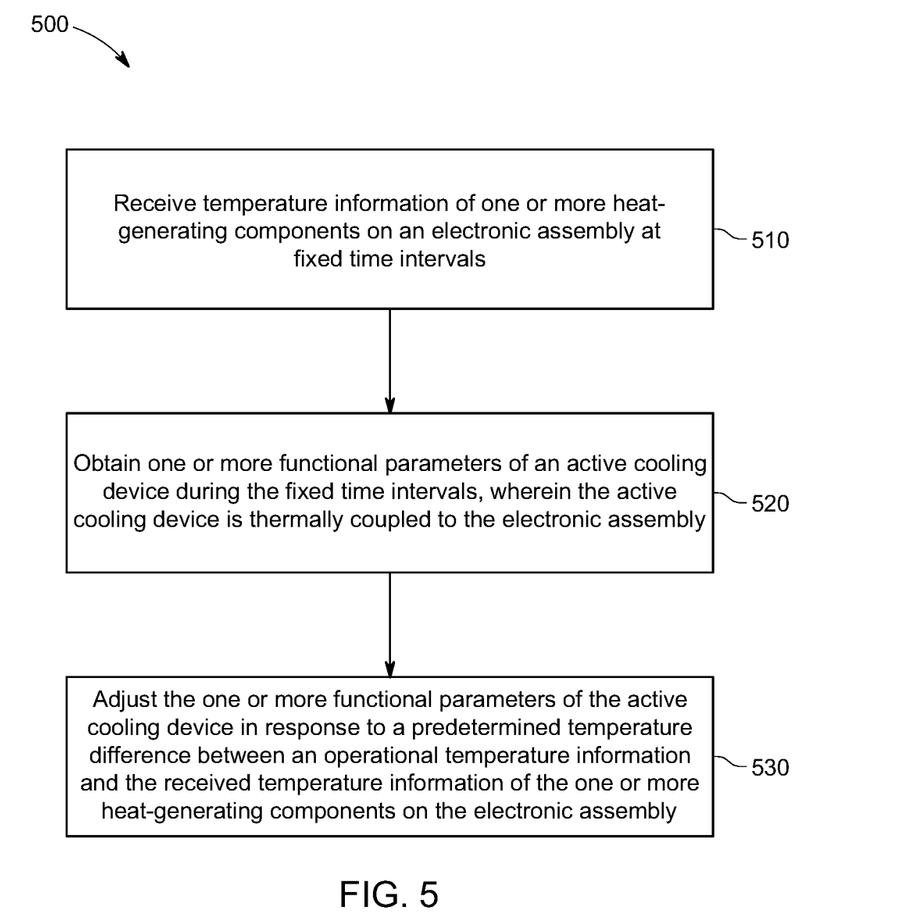
FIG. 5 shows a block diagram of the method of controlling an active cooling device thermally coupled to a network interface controller (NIC) expansion card in a computer system of FIGS. 1-3, according to one or more embodiments shown and described herein.

FIG. 5 shows a block diagram of the method 500 of controlling an active cooling device thermally coupled to a network interface controller (NIC) expansion card in a computer system, such as that shown in FIGS. 2-3. At block 510, a controller receives temperature information of one or more heat-generating components disposed on an electronic assembly at fixed time intervals such as about 10 seconds or 20 seconds. The one or more heat-generating components may include an application-specific integrated circuit; one or more transceivers; a printed circuit board on which the heat-generating components are disposed; and the like. The temperature information is detected by a temperature sensor thermally coupled to the one or more heat-generating components and/or the printed circuit board. The controller may include any suitable firmware or software that allows the functionality of the method 500. As an example, the controller may be a baseboard management controller in a computing server, as described above.

At block 520, the controller obtains one or more functional parameters of an active cooling device thermally coupled to the electronic assembly during the fixed time intervals. The active cooling device may be a blower, a liquid cooling system, a semiconductor cooling chip, or a heat pipe. In embodiments where the active cooling device is a blower, the one or more functional parameters is the speed of fans in the blower.

At block 530, the controller adjusts the one or more functional parameters of the active cooling device in response to a predetermined temperature difference between an operational temperature information and the received temperature information of the one or more heat-generating components from block 510. The operational temperature information of the one or more heat-generating components may include the maximum operating temperature as defined in the specification of the one or more heat-generating components. The predetermined temperature difference between the operational temperature information and the received temperature information of the one or more heat-generating components may be about 10° C. or about 20° C.

The method 400 and the method 500 are representative of example machine-readable instructions comprising an algorithm executed by a controller, such as the BMC 135. The algorithm may be embodied in software stored on tangible media such as a flash memory, a CD-ROM, a floppy disk, a hard drive, a digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application-specific integrated circuit (ASIC), a programmable logic device (PLD), a field programmable logic device (FPLD), a field programmable gate array (FPGA), discrete logic, etc.). For example, any or all of the components of the interfaces can be implemented by software, hardware, and/or firmware. Also, some or all of the machine readable instructions represented by the methods 400, 500 of FIGS. 4 and 5, respectively, may be implemented manually. Further, although the example algorithm is described with reference to the methods 400, 500 illustrated in FIGS. 4 and 5 respectively, persons of ordinary skill in the art will readily appreciate that many other methods of implementing the example machine-readable instructions may alternatively be used.

The embodiments of active cooling devices for cooling an electronic assembly positioned downstream in a computing system can be used advantageously to remove heat generated by one or more heat-generating components, transceivers, printed circuit board, and other electronic components on the electronic assembly. This helps facilitate efficient heat transfer from the electronic assembly such as an OCP module, resulting in power savings and improved performance during operation of the computing system.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

While various embodiments of the present invention have been described above, it should be understood that they have been presented by way of example only, and not limitation. Although the invention has been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

The invention claimed is:

1. An electronic assembly positioned downstream of a computing system, the electronic assembly comprising:
    a printed circuit board electrically connected to the computing system, the printed circuit board comprising:
        a transceiver socket configured to receive at least one optical transceiver, the at least one optical transceiver configured to mate with an active optical cable; and
        one or more heat-generating components disposed thereon;
    an air duct disposed over the printed circuit board; and
    an active cooling device thermally coupled to the printed circuit board wherein the one or more heat-generating components is thermally disposed within a heatsink and thermally coupled to a temperature sensor.

2. The electronic assembly of claim 1, wherein the one or more heat-generating components comprises an application-specific integrated circuit (ASIC).

3. The electronic assembly of claim 1, wherein the active cooling device is selected from one of: a blower, a liquid cooling system, a semiconductor cooling chip, and a heat pipe.

4. The electronic assembly of claim 1, wherein the active cooling device is fastened to the printed circuit board through the air duct.

5. The electronic assembly of claim 1, wherein the active cooling device is operably controlled through a baseboard management controller (BMC) disposed in a server system.

6. The electronic assembly of claim 1, wherein the air duct comprises:
an upstream portion at a first open end thereof, the upstream portion comprising:
a first portion having a first flat top surface at a first height from the printed circuit board;
a second portion having a sloping surface; and
a first sidewall on either side of the upstream portion;
a downstream portion at a second open end opposite to and downstream of the first open end, the downstream portion comprising:
a second flat top surface at a second height from the printed circuit board, the second height smaller than the first height; and
a second sidewall on either side of the downstream portion,
wherein the sloping surface connects the first flat top surface of the upstream portion with the second flat top surface of the downstream portion such that airflow entering the upstream portion at the first open end is directed to exit the downstream portion at the second open end.

7. A computing system comprising:
a plurality of fans configured to drive airflow downstream of the computing system; and
an electronic assembly positioned downstream of the computing system, the electronic assembly comprising:
a printed circuit board electrically connected to the computing system and comprising:
a transceiver socket configured to receive at least one optical transceiver, the at least one optical transceiver configured to mate with an active optical cable;
one or more heat-generating components disposed thereon;
an air duct disposed over the printed circuit board; and
an active cooling device thermally coupled to the printed circuit board;
wherein the one or more heat-generating components is thermally disposed within a heatsink and thermally coupled to a temperature sensor.

8. The computing system of claim 7, wherein the one or more heat-generating components comprises an application-specific integrated circuit (ASIC).

9. The computing system of claim 7, wherein the active cooling device is selected from one of: a blower, a liquid cooling system, a semiconductor cooling chip, and a heat pipe.

10. The computing system of claim 7, wherein the active cooling device is fastened to the printed circuit board through the air duct.

11. The computing system of claim 7, wherein the air duct comprises:
an upstream portion at a first open end thereof, the upstream portion comprising:
a first portion having a first flat top surface at a first height from the printed circuit board;
a second portion having a sloping surface; and
a first sidewall on either side of the upstream portion;
a downstream portion at a second open end opposite to and downstream of the first open end, the downstream portion comprising:
a second flat top surface at a second height from the printed circuit board, the second height smaller than the first height; and
a second sidewall on either side of the downstream portion,
wherein the sloping surface connects the first flat top surface of the upstream portion with the second flat top surface of the downstream portion such that airflow entering the upstream portion at the first open end is directed to exit the downstream portion at the second open end.

12. The computing system of claim 7, wherein the electronic assembly is a network interface controller (NIC) expansion card.

13. The computing system of claim 7, wherein the active cooling device is operably controlled through a baseboard management controller (BMC) disposed in the computing system.

14. An electronic assembly positioned downstream of a computing system, the electronic assembly comprising:
a printed circuit board electrically connected to the computing system, the printed circuit board comprising:
a transceiver socket configured to receive at least one optical transceiver, the at least one optical transceiver configured to mate with an active optical cable; and
one or more heat-generating components disposed thereon;
an air duct disposed over the printed circuit board; and
an active cooling device thermally coupled to the printed circuit board;
wherein the air duct comprises:
an upstream portion at a first open end thereof, the upstream portion comprising:
a first portion having a first flat top surface at a first height from the printed circuit board;
a second portion having a sloping surface; and
a first sidewall on either side of the upstream portion;
a downstream portion at a second open end opposite to and downstream of the first open end, the downstream portion comprising:
a second flat top surface at a second height from the printed circuit board, the second height smaller than the first height; and
a second sidewall on either side of the downstream portion,
wherein the sloping surface connects the first flat top surface of the upstream portion with the second flat top surface of the downstream portion such that airflow entering the upstream portion at the first open end is directed to exit the downstream portion at the second open end.

* * * * *